United States Patent
Jäntti et al.

(10) Patent No.: US 10,396,553 B2
(45) Date of Patent: Aug. 27, 2019

(54) SYSTEM AND METHOD FOR CONTROL OF MULTIPLE VOLTAGE REGULATORS

(71) Applicant: Telefonaktiebolaget L M Ericsson (publ), Stockholm (SE)

(72) Inventors: Joni Jäntti, Oulu (FI); Cecilia Andersson, Lund (SE); Bengt Edholm, Lund (SE); Masao Naruse, Tokyo (JP); Harri Nissi, Oulu (FI); Marko Pessa, Oulu (FI); Mikko Pulkkinen, Oulu (FI)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 1399 days.

(21) Appl. No.: 14/472,792

(22) Filed: Aug. 29, 2014

(65) Prior Publication Data
US 2016/0064928 A1    Mar. 3, 2016

(51) Int. Cl.
H02J 1/14 (2006.01)
G06F 1/3296 (2019.01)
G11C 5/14 (2006.01)

(52) U.S. Cl.
CPC .............. H02J 1/14 (2013.01); G06F 1/3296 (2013.01); G11C 5/147 (2013.01); Y02D 10/172 (2018.01)

(58) Field of Classification Search
CPC .......... G06F 1/3296; G11C 5/147; H02J 1/14; Y02B 60/1285
USPC ......................................................... 307/33
See application file for complete search history.

(56) References Cited

U.S. PATENT DOCUMENTS

| | | | |
|---|---|---|---|
| 5,946,242 A * | 8/1999 | Cho | G11C 5/147 365/189.06 |
| 6,700,359 B2 | 3/2004 | Daniels et al. | |
| 7,925,910 B2 | 4/2011 | Lee | |
| 2007/0132436 A1* | 6/2007 | Westwick | H02M 3/156 323/262 |
| 2007/0250219 A1* | 10/2007 | Gaskins | G06F 1/08 700/299 |
| 2009/0024856 A1* | 1/2009 | Lee | G11C 5/143 713/320 |
| 2011/0273156 A1* | 11/2011 | Miyamae | H02M 3/156 323/288 |
| 2012/0023345 A1* | 1/2012 | Naffziger | G06F 1/3206 713/320 |
| 2013/0311792 A1* | 11/2013 | Ponnathota | G06F 1/26 713/300 |
| 2015/0222181 A1* | 8/2015 | Coleman | H02M 3/156 323/288 |

\* cited by examiner

*Primary Examiner* — Thienvu V Tran
*Assistant Examiner* — Brian K Baxter
(74) *Attorney, Agent, or Firm* — Coats & Bennett, PLLC

(57) ABSTRACT

A power control system provides multiple supply voltages that are guaranteed not to violate boundary conditions regardless of the timing of voltage change commands. A first voltage ($V_{logic}$ in the embodiments described herein) is controlled conventionally, and a second voltage ($V_{memory}$) is either selected, or generated by adding a selected offset to the first voltage. Both the size of the offset, and the absolute value of the second voltage, are constrained at all times, by constraint values specific to the current voltage zone. The invention ensures a smooth transition between different voltage operating points, and ensures that the trajectory of change between specified operating points remains within predefined boundaries.

21 Claims, 6 Drawing Sheets

SYSTEM AND METHOD FOR CONTROL OF MULTIPLE VOLTAGE REGULATORS

FIELD OF INVENTION

The present invention relates generally to electronic circuits, and in particular to a system and method of dynamically controlling multiple voltage regulators to ensure strict relationships between the respective voltages at all times.

BACKGROUND

Portable electronic devices are ubiquitous accoutrements in modern life. Cellular telephones, smartphones, satellite navigation receivers, e-book readers and tablet computers, wearable computers (e.g., glasses, wrist computing), cameras, and music players are just a few examples of the many types of portable electronic devices in widespread use. Portable electronic devices are powered by batteries—either replaceable batteries such as alkaline cells, or rechargeable batteries such as NiCd, NiMH, LiOn, or the like. In either case, the useful life of portable electronic devices is limited by available battery power, which decreases in proportion to the length of use of the device, and the level of power consumption during that use.

Trends in portable electronic device design include higher levels of circuit integration, shrinking device form factors (and hence smaller batteries), increasing functionality, and wireless connectivity—all of which have made power management a critical area of optimization for portable electronic device designers.

Power management is particularly critical for very highly integrated circuits. Processing circuits, associated logic circuits (DMA, graphics processing, encryption, RF baseband processing, etc.) and memory are often integrated into the same IC die (or separate dice that are packaged together). This is known in the art as "System On a Chip," or SOC. One approach to intelligent power management on SOC, which may include circuits having different power consumption profiles and operating frequencies, is to dynamically vary the clock frequency and voltage levels of power supplies during operation, in response to instantaneous demand (processing load, communications activity, and the like). This is known as Dynamic Voltage and Frequency Scaling (DVFS) or Dynamic Voltage Scaling (DVS). DVFS/DVS is routinely employed for battery-powered SOC, because maintaining voltage levels at the levels required for maximum operational performance will cause average battery power life to be significantly lower than when voltage levels are scaled dynamically along with the required performance. For example, for digital devices, supplying a voltage level 10% higher than required results in at least 21% higher power consumption drawn from the battery. DVFS/DVS is also advantageous from the perspective of thermal management.

SOC typically have a power architecture with numerous power rails running inside the silicon die (with different requirements for voltage, current, and power sequence). The power rails in the SOC are typically supplied from analog mixed signal components, such as voltage regulators (also called as power supplies). The voltage regulator outputs typically have a built-in slew rate control, to protect the system from battery surge currents when the regulator output voltages are changed.

There are usually some dependencies between power rails in the SOC due to the fact that two or more power supplies are fed to single components at many places of the die. For example, this is the case for level shifter components that are inserted when signals traverse from one power domain to another. The level shifter is then connected to the supplies of both power domains. However, in some situations there are speed constraints that preclude the use of a traditional level shifter. One such case, where special constraint between the power supplies can exist on a SOC, is the on-chip memory. The supply voltage for the memory array (called $V_{memory}$) is ideally higher than the supply voltage for the digital interface (called $V_{logic}$). This is because the noise instability is higher for memory cell than for logic cells, and this is generally true for any kind of CMOS process designs. However, inserting level shifters between the memory array and its interface logic may not be practical, due to the number of such connections, and/or performance constraints. Accordingly, the two circuits may be operated at different voltages. However, the memory array voltage supply must meet certain voltage boundary conditions in order for the memory to work at the required speed.

For example, the voltage boundary conditions may be specified as:

$$V_{memory} - V_{logic} < 350 \text{ mV},$$

and $$V_{logic} - V_{memory} < 200 \text{ mV}.$$

If one of the $V_{memory}$ or $V_{logic}$ supply voltages is changed, then the other must change accordingly to ensure that the voltage boundary conditions are met at all times, in order to guarantee proper memory operation. Since DVFS/DVS is required for reasonable power consumption for SOC, changing two power supplies in a precise, rapid and linked way is necessary for the SOC device to work correctly, and power efficiently.

One known SOC is a baseband processor for a wireless communication device. This chip includes both digital logic and on-chip memory, with the power supplies for both circuits tied together; a single voltage regulator supplies power for the entire chip. Because the memory array and digital logic voltages are tied together, the memory array cannot be operated at a higher voltage than the digital core logic. The allowed voltage range for digital core logic of the SOC is thus more narrow than otherwise possible, and hence the power consumption is higher than optimum.

Another known SOC—a more sophisticated solution for a wireless communication device—is a two-chip solution tightly integrating a baseband processor and RF transceiver. In this SOC, the memory array power supply is a Low Drop Out (LDO) regulator, and the digital logic power supply is a switching DCDC power supply. In this case, $V_{memory}$ is fixed, and $V_{logic}$ may vary over an acceptable range without violating the voltage boundary conditions. While this solution improves performance, it still restricts $V_{logic}$, which in some use cases must be higher than it could otherwise be, due to $V_{memory}$ being fixed.

The simple solution of making both $V_{memory}$ and $V_{logic}$ independently variable is problematic. First, there can be unspecified delays between the commands that control $V_{memory}$ and those that control $V_{logic}$. This can result in the voltage boundary conditions to be broken temporarily. Second, the voltages may have different ramp times, making it complicated to adjust the delay between two commands. Third, since the voltage changes are driven by operating conditions, there can be a sudden need to achieve a new operation point while the transition to a previous one is still in progress, resulting voltage trajectories that are difficult to predict, and which hence may violate boundary conditions.

The changes to $V_{memory}$ and $V_{logic}$ could be broken into numerous small steps, and the incremental changes interleaved between the two voltage supplies. This would make it possible to adjust the voltages without violating boundary conditions. However, it would introduce significant delay, resulting in increased power consumption. In some cases, such an approach may fail to achieve required supply levels quickly enough to meet operational demands.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a power control system provides multiple supply voltages that are guaranteed not to violate boundary conditions regardless of the timing of voltage change commands. The invention is presented in the context of two power supply voltages; however, it may easily be extended to multiple outputs. A first voltage ($V_{logic}$ in the embodiments described herein) is controlled conventionally, and a second voltage ($V_{memory}$) is either selected, or generated by adding a selected offset to the first voltage. Both the size of the offset, and the absolute value of the second voltage, are constrained at all times, by constraint values specific to the current voltage zone. The invention ensures a smooth transition between different voltage operating points, and ensures that the trajectory of change between specified operating points remains within predefined boundaries.

One embodiment relates to a method of controlling a plurality of supply voltages provided to one or more electronic circuits, wherein permissible values of at least first and second voltages of the plurality are constrained both absolutely and relative to each other. A range of permissible values of the first voltage is divided into two or more zones. A plurality of Operating Performance Points (OPP) is defined, each OPP specifying values for the first and second voltages. A target OPP is selected, and a first voltage value is ramped from a current value to the target OPP value for the first voltage. A target second voltage value is generated within each zone by one of: selecting a target second voltage value, and selecting a target offset value and adding the target offset value to the first voltage value. The second voltage value is ramped from a current value to the generated target value for the current zone. The second voltage value is constrained, both in the voltage value and in the difference between the second voltage value and the first voltage value, the constraints being unique to each zone.

Another embodiment relates to a power management unit. The power management unit includes a digital control circuit operative to generate first and second voltage values that gradually ramp between selected Operating Performance Points (OPP), each OPP specifying values for the first and second voltages, in response to OPP selections communicated to the power management unit. The power management unit also includes first and second voltage regulators operative to convert the first and second voltage values to first and second supply voltage signals having corresponding voltage levels. The digital control circuit includes a plurality of registers storing OPP voltage values and at least one trigger point value. The trigger points divide a permissible range of values of the first voltage into two or more zones. The digital control circuit also includes a regulator control circuit operative to generate the first and second voltage values according to OPP target values read from the registers. The second voltage value is constrained, both in the voltage value and in the difference between the second voltage value and the first voltage value, the constraints being unique to each zone.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
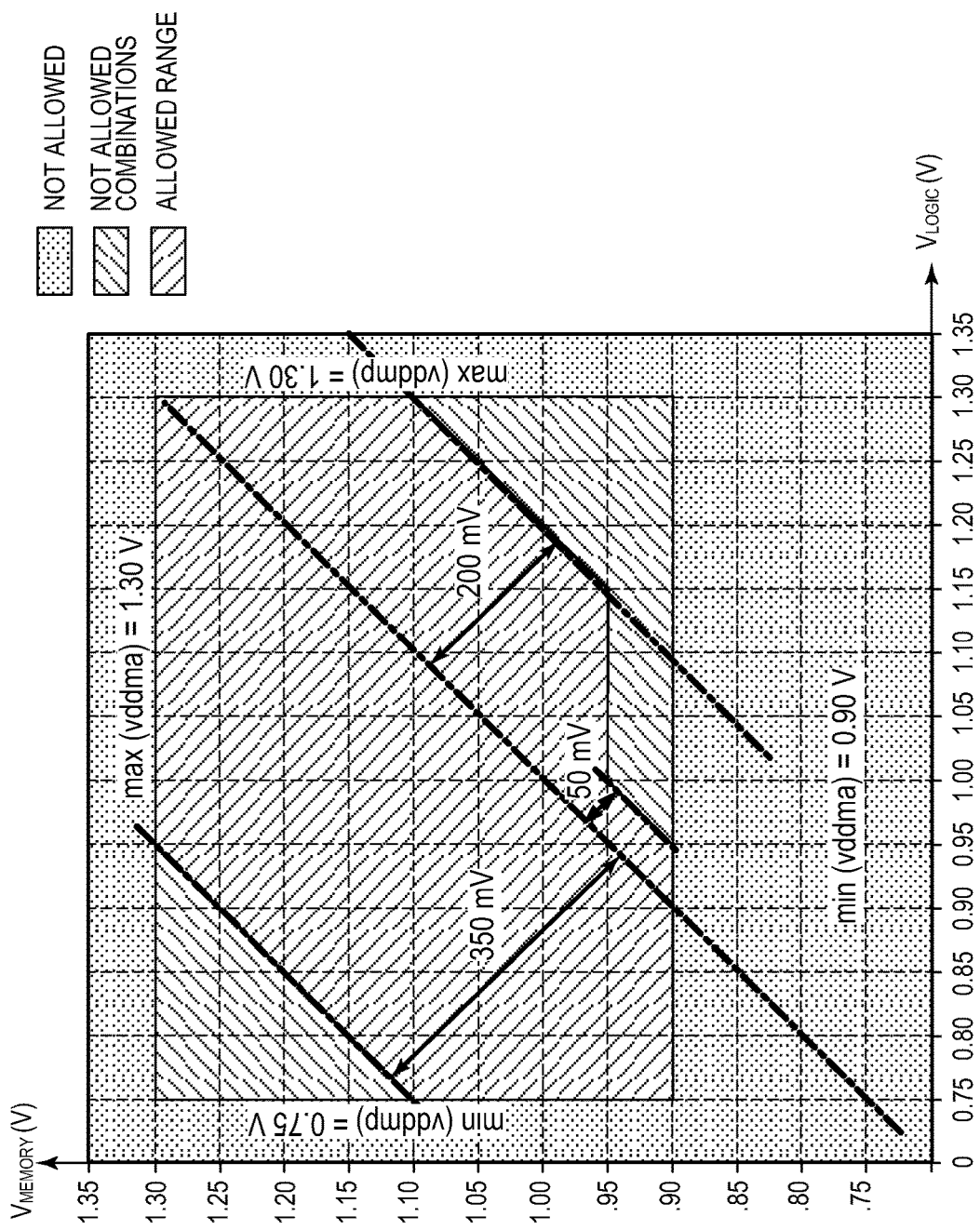
FIG. 1 is a graph of absolute and relative constraints of and between two supply voltages.

FIG. 1 depicts a graph of the relationship between a first power supply voltage applied to digital logic circuits ($V_{logic}$) and a second power supply voltage applied to a memory array ($V_{memory}$). FIG. 1 depicts, in the dotted area, absolute voltage values that are impermissible—neither $V_{logic}$ nor $V_{memory}$ may extend into these regions. The graph also depicts, in positive-slope hashing, regions within the allowed maximum range, but which represent an impermissible combination—that is, a combination of $V_{logic}$ and $V_{memory}$ that violates one or more boundary conditions. The negative-slope hashed area of FIG. 1 represents values of $V_{logic}$ and $V_{memory}$ that are legal combinations. Any point within this area may be selected as an Operating Performance Point (OPP).

An OPP is a pre-defined $V_{logic}$-$V_{memory}$ relationship point, where appropriate voltage levels are specified for low power consumption, high performance, or some compromise between these goals. OPPs are programmed in software or a hardware state machine and transitions between them are implemented by a system controller. If the system controller decides to move from one OPP to another OPP, the consequence is a voltage adjustment path (trajectory), which shows the voltage level relationship at particular voltage levels. Since the SOC is operating during the voltage level transitions, it is critical that the voltage trajectory between OPPs remain within the grey area.

It is possible for software to pre-program the various OPP control parameters, and configure the system controller to change OPPs upon a change in the state of hardware control signals. This method is advantageous in terms of speed.

Figure 2:
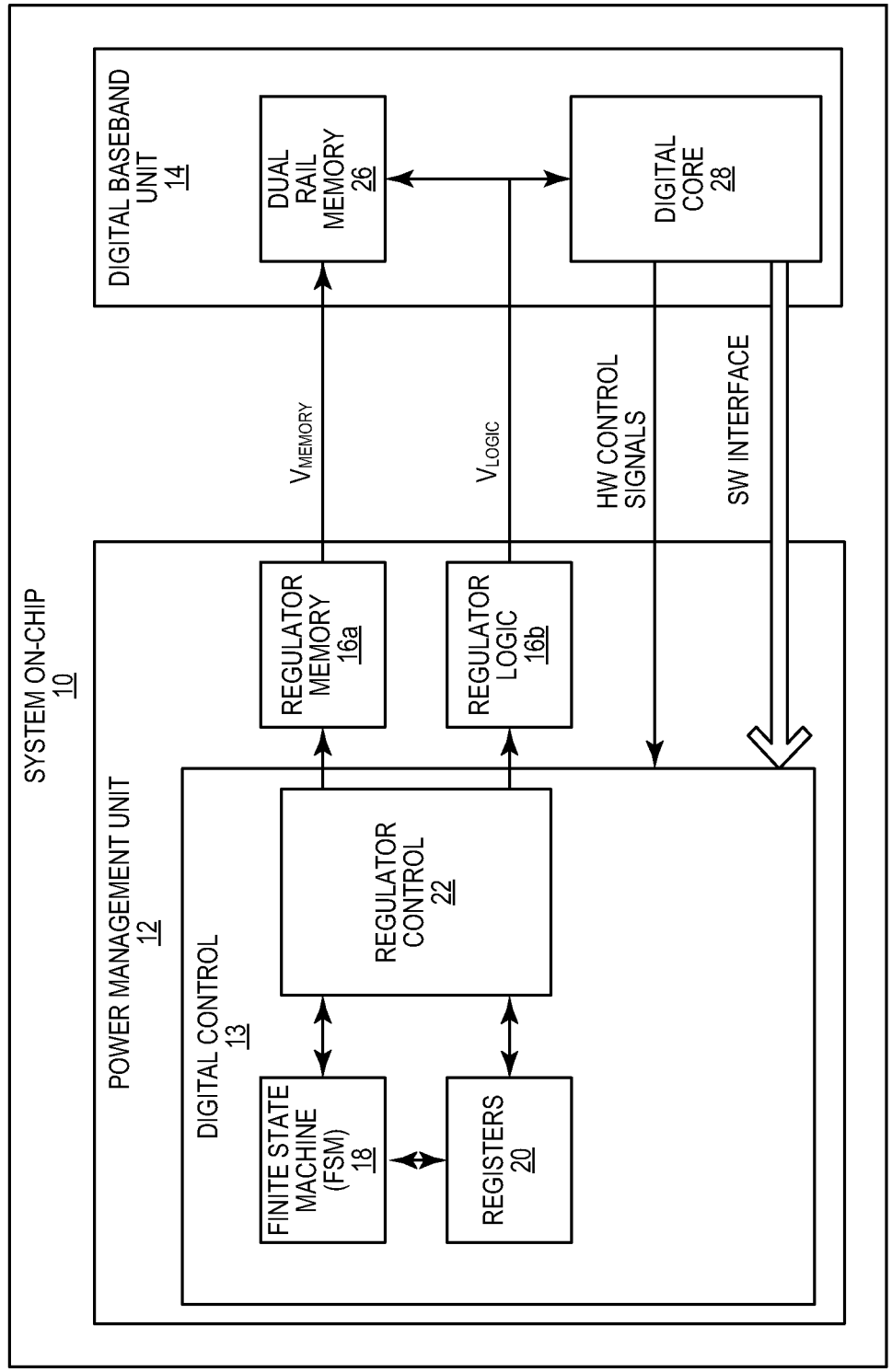
FIG. 2 is a functional block diagram of a System on a Chip.

FIG. 2 depicts a block diagram of a SOC 10. The SOC 10 includes a power management unit 12 and a digital processing unit 14. The power management unit 12 includes a digital control block 13 and (in this embodiment) two voltage regulators 16a and 16b, generating $V_{memory}$ and $V_{logic}$, respectively. In other embodiments, the digital control block 13 may generate more than two voltage values, and additional voltage regulators 16n may generate a corresponding number of supply voltages. The digital control block 13 includes a finite state machine 18, registers 20, and a regulator control block 22. The regulator control block 22 comprises hardware that implements a software-configurable dual power supply controller, under the control of the state machine 18, and relying on pre-programmed OPPs and other boundary condition data. In various embodiments, as described in greater detail herein, data used by the regulator control block 22 may include OPP voltage values (or an offset to be added to another voltage to generate an OPP voltage value), constraints on the absolute voltage value or offset value of one or more voltages for various zones, and voltage values defining voltage zones. In some embodiments, this data may be stored in registers 20 during an initialization phase, and accessed by the regulator control block 22 during an operational phase. In other embodiments, some of the data may be communicated to the regulator control block 22 dynamically during the operational phase, such as via a data communication bus.

The digital processing unit 14, which may for example implement a digital baseband processor for a portable communication device, includes a digital core 28 and a memory array 26. By strictly controlling the boundary conditions between the digital core logic supply voltage $V_{logic}$ and the memory array supply voltage $V_{memory}$, optimal performance may be achieved without requiring level shifters at every point of interface between the digital core 28 and the memory array 26. The digital core 28 controls the power management unit 12 by programming register 20 values via software, and by hardware control signals that transition the regulator control block 22 between predefined OPPs.

The regulator control block 22 generates digital inputs to voltage regulators 16a and 16b that generate the $V_{memory}$ and $V_{logic}$ power supply voltages. The $V_{memory}$ power supply voltage is generated by applying a predetermined offset to the $V_{logic}$ power supply voltage. This ensures both that the offset does not violate any boundary conditions, and that $V_{memory}$ remains within the permissible absolute value range. The power management unit 12 operates, under the control of the digital core 28, to transition from one OPP to another. Accordingly, OPPs are predefined, and information about the OPPs is stored in registers 20 prior to operation. This information includes the $V_{logic}$ voltage of each OPP, the offset of $V_{memory}$ from $V_{logic}$ at that OPP, trigger point voltage values defining voltage zones, a plurality of minimum and maximum values for the offset between $V_{logic}$ and $V_{memory}$ per zone, and a plurality of absolute maximum and minimum permissible values for $V_{logic}$ and $V_{memory}$ per zone.

Figure 3:
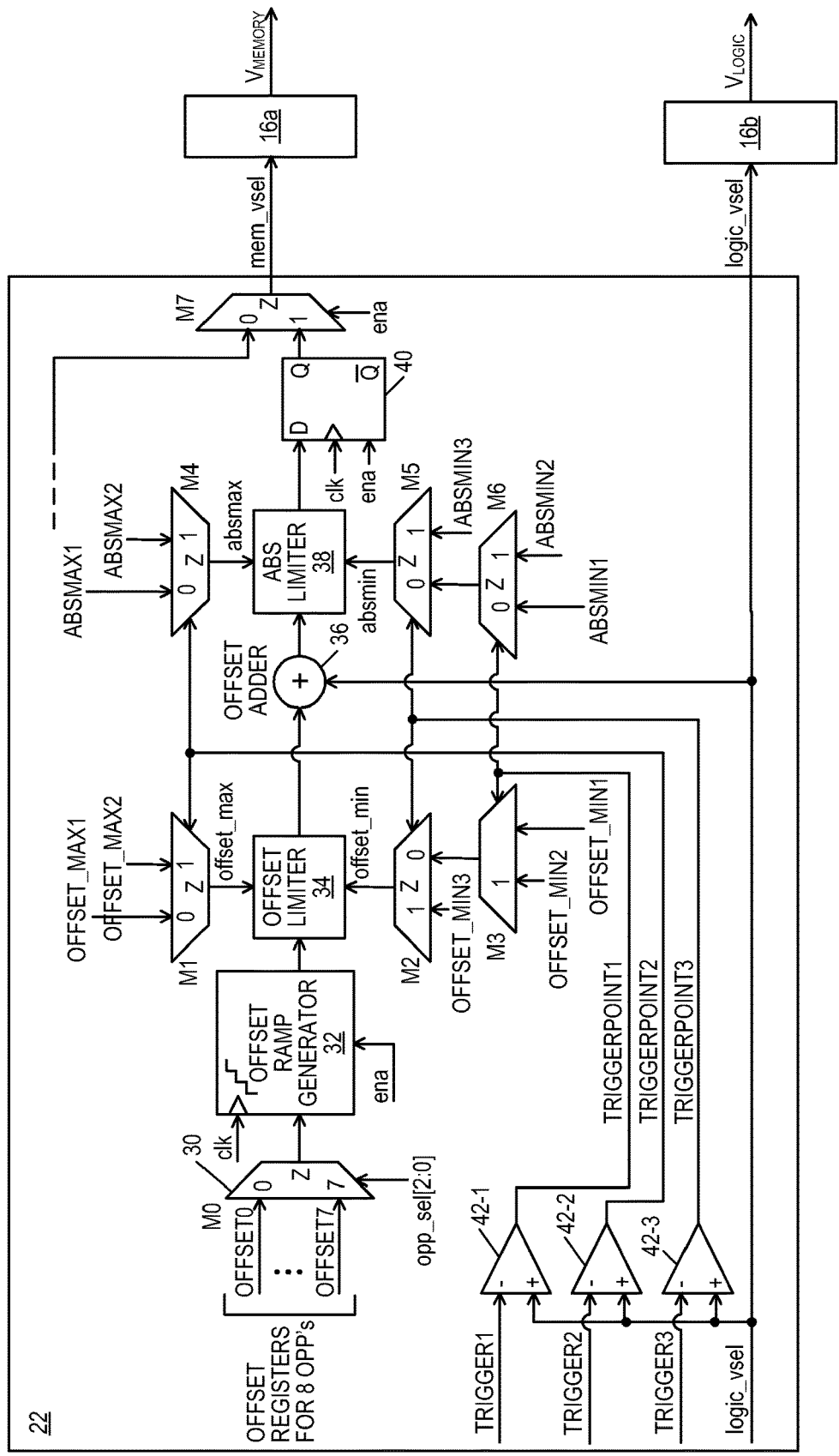
FIG. 3 is a functional schematic diagram of a first embodiment of the regulator control circuit of FIG. 2.

FIG. 3 depicts a detailed functional schematic diagram of the regulator control block 22. Schematic symbols of, e.g., comparators, multiplexors, and the like are functional indicators; the regulator control block 22 is digital. The logic_vsel data is generated conventionally—e.g., by a counter (not shown)—to set the $V_{logic}$ voltage level to a predetermined value for a selected OPP. This data is converted by voltage regulator 16b (which includes DAC functionality) into the $V_{logic}$ supply voltage provided to the digital logic 28. The regulator control block 22 simultaneously generates mem_vsel data to set the corresponding $V_{memory}$ voltage level for the selected OPP. The mem_vsel data is converted by voltage regulator 16a into the $V_{memory}$ supply voltage provided to the memory array 26.

Operation of the regulator control block 22 is best explained in the context of a transition from a first OPP to a second OPP. The digital core 28 indicates the selected new OPP to the power management unit 12, such as by encoding an OPP identification on an opp_sel[2:0] signal. The opp_sel [2:0] data will retrieve the target $V_{logic}$ value for the selected OPP, and ramp (not shown) the logic_vsel data from a current value to the target value to generate the target $V_{logic}$ voltage. Simultaneously, the opp_sel[2:0] lines select by multiplexer M0, an OFFSETn from among a plurality of OFFSETs programmed into registers 20.

To prevent sudden changes in the memory array supply voltage $V_{memory}$, which may cause deleterious effects such as supply rail ringing, current inrush, or the like, an offset ramp generator 32 gradually ramps the mem_vsel data from its current value to the value indicated by the offset data retrieved from a register 20, over an appropriate duration (i.e., number of clock pulses).

The OFFSETn value is then limited, in offset limiter block 34, to conform to boundary conditions. In general, the boundary conditions may vary across the $V_{logic}/V_{memory}$ voltage space. That is, an OPP with a relatively high value of $V_{logic}$ may allow a greater offset of $V_{memory}$ from the $V_{logic}$ value, than would be the case for an OPP with a relatively low value of $V_{logic}$. The permissible maximum and minimum offset values thus depend on the value—or at least the neighborhood—of $V_{logic}$.

To select the proper maximum and minimum offset values, a plurality of trigger points is defined, and programmed into registers 20 prior to use. Trigger points separate the extent of permissible $V_{logic}$ values into zones, over which the boundary conditions are fairly close, and for which a maximum and minimum offset (and absolute $V_{memory}$ value) may be defined. In this embodiment, three trigger points are defined, delineating four zones. The first and second trigger points control the minimum constraint values, and the third trigger point controls the maximum constraint values.

Assume the SOC 10 has been operating at an OPP with low voltage values for $V_{logic}$ and $V_{memory}$ (i.e., below all trigger points). An increased computational load prompts the digital core 28 to specify a higher-voltage OPP. The logic_vsel data value increases, and the OFFSETn value corresponding to the selected OPP is retrieved and ramped up by the ramp generator 32. The logic_vsel value is compared to (in this embodiment) three TRIGGER values (stored in registers 20) at comparators 42-1, 42-2, and 42-3. As the logic_vsel value increases past the value of TRIGGER1, the output of comparator 42-1, or TRIGGERPOINT1, transitions to a 1; TRIGGERPOINT2 and TRIGGERPOINT3 remain 0. These signals are the select inputs to multiplexers M1-M6. The data inputs to the multiplexers M1-M6 are various pre-programmed maximum and minimum offset and absolute values (stored in registers 20), which constrain the generated $V_{memory}$ voltage. For example, as the logic_vsel value passes the first trigger point, the TRIGGERPOINTn outputs are <1 0 0>, which select OFFSET_MIN2 and OFFSET_MAX1.

The OFFSET value retrieved from registers 20 (and ramped up to its full value) is constrained to these minimum and maximum values at the offset limiter block 34. The constrained offset value is then added to the logic_vsel value at the adder 36 to generate a preliminary mem_vsel value. As the logic_vsel value increases, on the way to the selected OPP, the preliminary mem_vsel value will increase as well, since the constrained offset value is added to logic_vsel to generate mem_vsel. However, at no point will mem_vsel violate the applicable boundary condition that its offset from logic_vsel be within predefined limits.

In a manner similar to the limiting of the offset, the magnitude, or absolute, value of $V_{memory}$ is also limited, to be within pre-programmed minimum and maximum values for each trigger point-defined zone. The TRIGGERPOINTn signals of <1 0 0> select ABSMIN2 and ABSMAX1. The output of the adder 36 is limited to be within these values at ABS limiter block 38, generating the final mem_vsel. This data are latched at flip-flop bank 40. The output of the flip-flop bank 40, if not bypassed at multiplexer M7, is the final mem_vsel value, which is the input to the voltage regulator 16a, which generates the $V_{memory}$ supply voltage provided to the memory array 26. Inspection of FIG. 3 yields the following table of constraints applied to the generated offset voltage, along with representative values applicable to an example presented in FIG. 4.

Figure 4:
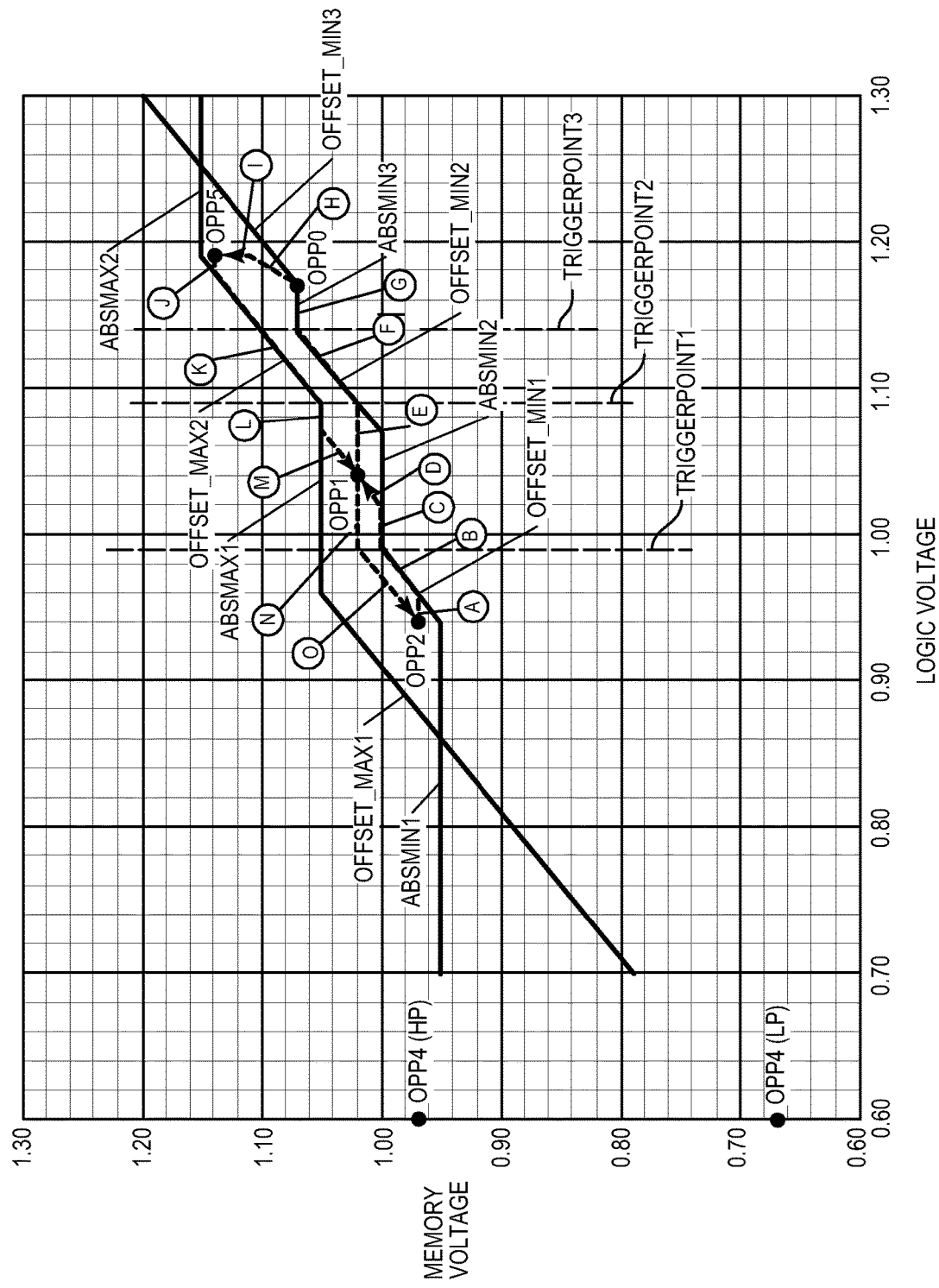
FIG. 4 is a graph of two supply voltages and transitions between operating performance points.

Referring to FIG. 4, assume the SOC 10 is initially operating at OPP2, below TRIGGERPOINT1, and the digital core 28 issues a command to move to OPP1. The initial voltage trajectory is a flat, horizontal line from $V_{logic}$=0.94 V to 0.96 V, because the $V_{logic}$ voltage is rising while the offset is ramping down from +30 mV to −20 mV. This segment is indicated in FIG. 4 by the label A. At the point $V_{logic}$=0.96 V, the offset is +10 mV, and is limited by the OFFSET_MIN1 limit value—the offset cannot fall below that value in this zone. The $V_{memory}$ value then follows the increase in $V_{logic}$, with a +10 mV offset, along the trajectory segment labeled B, until TRIGGERPOINT1 is reached at $V_{logic}$=0.99 V. Note that without OFFSET_MIN1 limiting the $V_{memory}$ value, the voltage trajectory would be straight line until $V_{logic}$=0.99 V and the $V_{memory}$ would assume impermissible values.

As $V_{logic}$ crosses TRIGGERPOINT1 at 0.99 V, the OFFSET_MIN1 limit no longer applies. However, $V_{memory}$ is in this zone constrained by ABSMIN2=1.00 V. Hence, along segment C, as $V_{logic}$ increases to 1.02 V, $V_{memory}$ is constrained to 1.00 V. The applied offset of −20 mV is only applicable without constraint as $V_{logic}$>1.02V, along segment D. This offset is applied until OPP1 is reached.

If the power management unit 12 is then commanded to move to OPP0, a similar trajectory results. $V_{logic}$ increases while the offset ramps down from −20 mV to −100 mV, resulting in a flat, horizontal trajectory along segment E. As $V_{logic}$ crosses TRIGGERPOINT2 at 1.09 V, $V_{memory}$ is constrained by the OFFSET_MIN2 limit of −70 mV, which is applied, along segment F, until $V_{logic}$ crosses TRIGGERPOINT3 at 1.14 V. In this zone, the absolute minimum permissible value of $V_{memory}$ is ABSMIN3=1.07 V. $V_{memory}$ is maintained at this value, along segment G, until $V_{logic}$ reaches OPP0.

TABLE 1

Constraint Values as a Function of Trigger Points

| TRIGGERPOINT COMPARATOR OUTPUTS 1-3 | MINIMUM OFFSET | MAXIMUM OFFSET | MINIMUM ABSOLUTE | MAXIMUM ABSOLUTE |
|---|---|---|---|---|
| 0 0 0 | OFFSET_MIN1 10 mV | OFFSET_MAX1 90 mV | ABSMIN1 0.95 V | ABSMAX1 1.05 V |
| 1 0 0 | OFFSET_MIN2 −70 mV | OFFSET_MAX1 90 mV | ABSMIN2 1.00 V | ABSMAX1 1.05 V |
| 1 1 0 | OFFSET_MIN2 −70 mV | OFFSET_MAX2 −40 mV | ABSMIN2 1.00 V | ABSMAX2 1.15 V |
| 1 1 1 | OFFSET_MIN3 −100 mV | OFFSET_MAX2 −40 mV | ABSMIN3 1.07 V | ABSMAX2 1.15 V |

FIG. 4 depicts the operation of the power management unit 12 as the SOC 10 transitions between various representative OPPs. These OPPs are listed in Table 2.

TABLE 2

Representative OPP Values

|  | OPP0 | OPP1 | OPP2 | OPP5 |
|---|---|---|---|---|
| $V_{logic}$ | 1.17 V | 1.04 V | 0.94 V | 1.19 V |
| $V_{memory}$ offset | −100 mV | −20 mV | 30 mV | −50 mV |

The three trigger points defined for the SOC 10 divide the $V_{logic}$ voltage range into four zones. These trigger point voltages are as follows:
TRIGGERPOINT1=0.99 V
TRIGGERPOINT2=1.09 V
TRIGGERPOINT2=1.14 V If the power management unit 12 is then commanded to move to OPP5, a very steep climb in the trajectory occurs along segment H, due to both $V_{logic}$ increasing, and the offset ramping up from −100 mV to −50 mV. After $V_{logic}$ reaches its OPP5 value of 1.19 V, the offset continues to increase, causing a vertical trajectory along segment I, until the offset reaches −50 mV, yielding $V_{memory}$=1.14V at OPP5. Note that the trajectory from OPP0 to OPP5 was unconstrained, either in the offset or the absolute voltage value of $V_{memory}$.

Continuing the example, the power management unit 12 is next commanded to move again to OPP1. Initially, along segment J, $V_{logic}$ decreases while the offset ramps up from −50 mV to −20 mV, resulting in a flat horizontal line. However, the offset quickly hits the limit OFFSET_MAX2 of −40 mV, and is constrained to this value along segment K, until $V_{logic}$ passes TRIGGERPOINT2. In this region, the ABSMAX1 limit of 1.05 V applies, constraining $V_{memory}$ to this value along segment L, until the offset reaches its target value of −20 mV (due to $V_{logic}$ decreasing to 1.07 V). An unconstrained −20 mV offset is then applied along segment M, until reaching OPP1.

In moving from OPP1 to OPP2, the offset ramps up from −20 mV to +30 mV, while $V_{logic}$ decreases, resulting in a flat, horizontal trajectory along segment N. At $V_{logic}$=0.99 V, the target offset of +30 mV is reached, and is maintained as $V_{logic}$ decreases, along segment O, to OPP2. Note that the change in trajectory between segments N and O coincided with crossing TRIGGERPOINT1; however, the corresponding change in offset and absolute constraints did not affect the trajectory in this example.

The transitions between OPPs, described with reference to FIG. 4, demonstrate voltage trajectories for a hypothetical SOC 10, as it transitions from a power-conserving mode (OPP2) through increased power demands to a high-performance mode (OPP5), and back, with different constraints applied in different voltage zones. However, the power management unit 12 according to embodiments of the present invention also may arbitrarily be commanded from any $V_{logic}/V_{memory}$ voltage relationship point—either an OPP or a transition point between OPPs—to any OPP, and it is guaranteed to observe all boundary conditions (i.e., constraints on offset and $V_{memory}$ value for the relevant trigger point zone). This is because as $V_{logic}$ crosses a trigger point into a different zone, different limiting values may apply, and $V_{memory}$ will be constrained accordingly.

FIG. 4 demonstrates that arbitrarily complex rules and boundary conditions regarding the relative voltage values between two supply voltages, such as $V_{logic}$ and $V_{memory}$, may be implemented with a few simple constraints on the offset value and absolute voltage values of the second voltage value, and by defining the zones where the different constraints apply by setting a few trigger points. In any implementation, those of skill in the art may easily set the OPPs, constraints, and trigger points based on the requirements of a particular SOC 10 or other circuit. Furthermore, the inventive concept may easily be extended to generate any number of dependent voltages as offsets from a primary voltage, each with the same or different constraints and trigger points.

Figure 5:
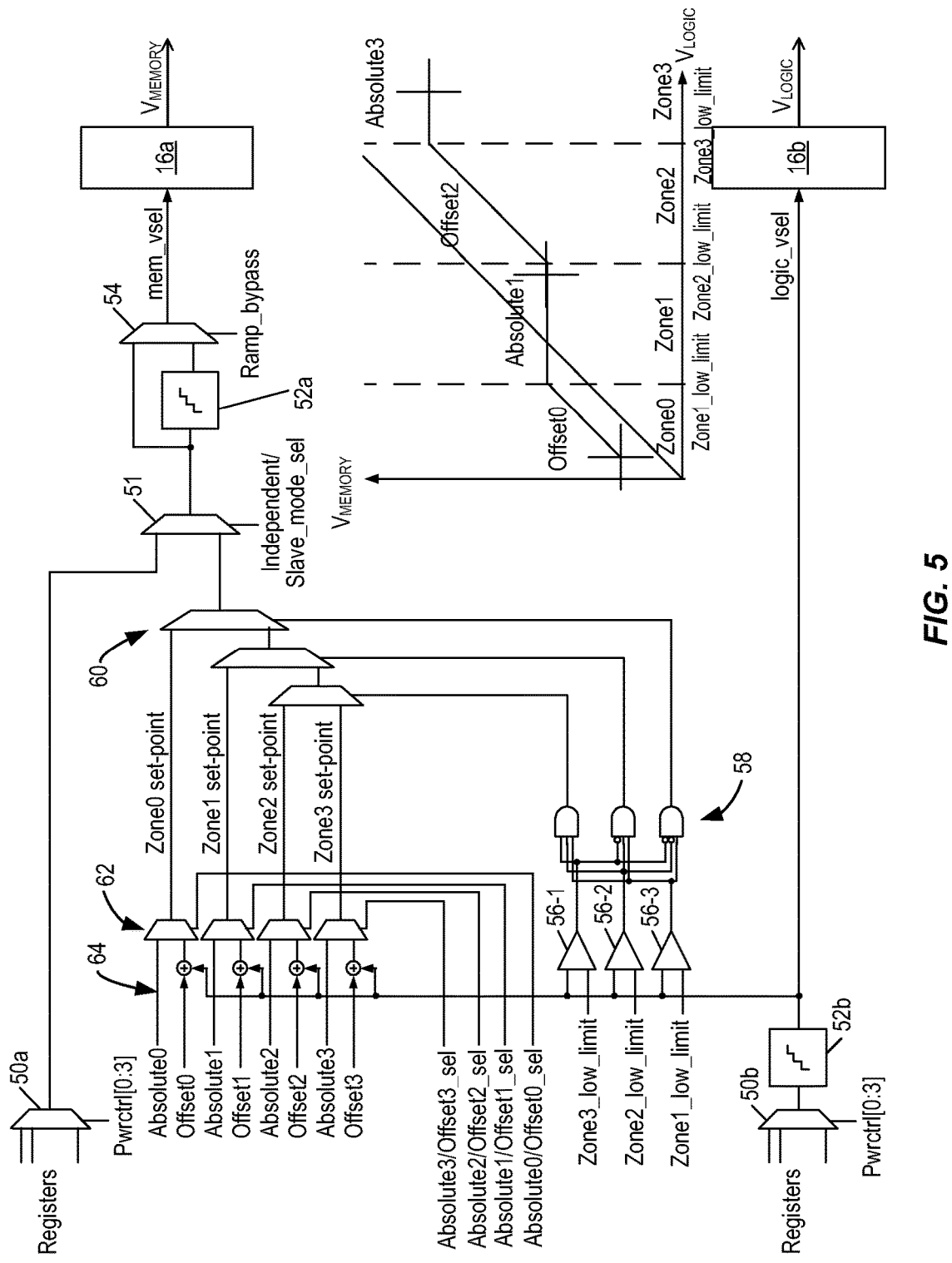
FIG. 5 is a functional schematic diagram of a second embodiment of the regulator control circuit of FIG. 2.

FIG. 5 depicts an alternative embodiment of the regulator control unit 22. A Pwrctrl[0:3] signal selects voltage levels for both $V_{memory}$ and $V_{logic}$, at multiplexers 50a and 50b, respectively. According to multiplexer 51, the target $V_{memory}$ level may be selected directly, or a per-zone constrained value may be selected. Ramp circuits 52a, 52b gradually ramp the voltages $V_{memory}$ and $V_{logic}$ from current values to the selected values (although this feature may be bypassed for $V_{memory}$ by multiplexer 54).

Figure 6:
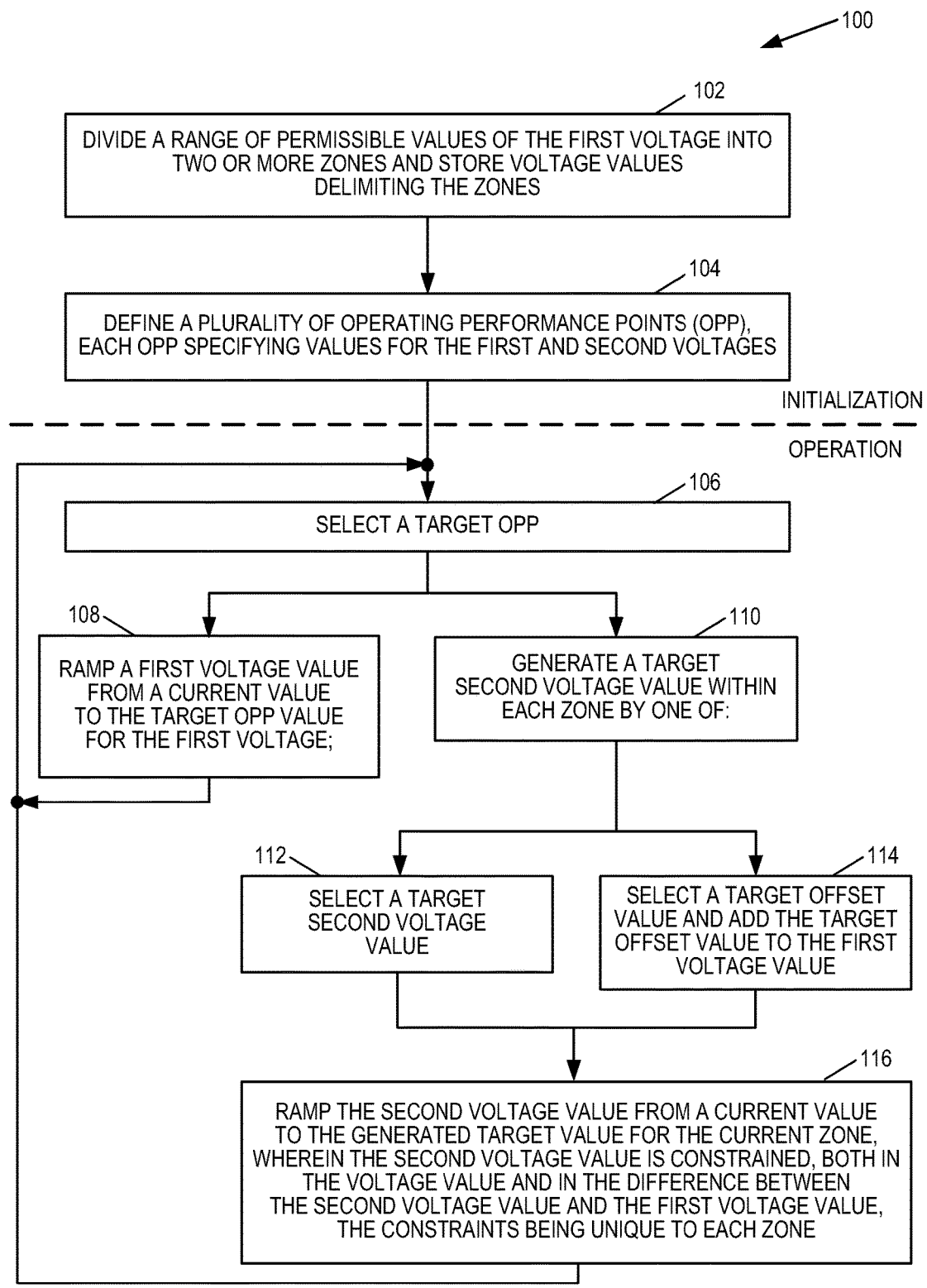
FIG. 6 is a flow diagram of a method of controlling a plurality of supply voltages.

In the mode that $V_{memory}$ is constrained in each zone, digital comparators 56-1, 56-2, and 56-3 compare $V_{logic}$ to predetermined voltage zone boundary values denoted Zonen_low_limit. These comparators operate similarly to the trigger point comparators 42 of FIG. 3, to divide the $V_{logic}$ voltage range into two or more zones. The $V_{logic}/V_{memory}$ graph inset in FIG. 6 depicts these zones. Logic gates 58 decode the zone comparison outputs to generate selectors for Zonen_set_point multiplexers, which select the set point to provide to the ramp generator 52a, depending on the active zone. That set point, for each zone, may be an absolute value retrieved from registers 20, or an offset, also retrieved from registers 20, and applied to logic_vsel by adders 64. This selection between predetermined absolute value or offset to logic_vsel is determined, independently for each zone, by Absoluten/Offsetn_sel signals.

The graph in FIG. 5 depicts three OPPs, depicted by + symbols. This graph depicts the case that offsets are selected by multiplexers 62 for zones 0 and 2, which are added to logic_vsel, and hence the voltage trajectory rises with a constant slope across these zones. Absolute values are selected for zones 1 and 3, which match the mem_vsel value at the end of the preceding zone, resulting in a flat, horizontal trajectory across these zones. In this embodiment, voltage trajectories across zones are directly selected, as opposed to the embodiment of FIG. 3, which defines and enforces zone-specific limits for possible trajectories. Also, the embodiment of FIG. 5 is limited to one OPP per zone, which may be sufficient for many designs (or more zones may be defined).

FIG. 6 depicts a method 100 of controlling a plurality of supply voltages provided to one or more electronic circuits, wherein permissible values of at least first and second voltages of the plurality are constrained both absolutely and relative to each other. In an initialization phase, above a dashed line in FIG. 6, the range of permissible values for a first voltage is divided into two or more zones, and one or more trigger point voltage values delimiting the zones are stored to registers 20 (block 102). A plurality of operating performance points (OPP), each OPP specifying values for the first and second voltages and boundary conditions, are defined (block 104). The OPP values (in the case of the second voltage, either absolute voltage values or offsets, per zone) are also stored in registers 20.

In an operational phase, below the dashed line, a target OPP is selected (block 106), such as by a digital core 28 of an SOC 10, and the selected OPP is communicated to the power management unit 12. Two actions then proceed in parallel. First, the first voltage value is gradually ramped from a current value to the OPP value for the first voltage (block 108). Second, a target second voltage value within each zone is generated (block 110). This may occur two ways: either the target second voltage value is selected from a register (block 112), or a target offset value is selected from a register 20, and added to the first voltage value (block 114). However the target second voltage is generated, a second voltage value is ramped from a current value to the generated target value for the current zone (block 116) The second voltage value is constrained, both in the voltage value and in the difference between the second voltage value and the first voltage value, wherein the constraints are unique to each zone (block 116). The operational process may be repeated by selecting a new target (predefined) OPP (block 106).

Embodiments of the present invention present numerous advantages over the prior art. More optimal and power-efficient performance of SOC is possible, as greater freedom is provided in supplying different circuits (such as memory arrays and digital logic) with different supply voltages. Where a large number of level shifters is impractical and hence strict relationships between the relative levels of the voltages are imposed by circuit constraints, embodiments of the present invention guarantee that these relationships, or boundary conditions, are not violated at any time. This guarantee is independent of the speed or timing of software commands, and the guarantee holds thorough even unpredictable transitions, such as commanding a first OPP, and then commanding a second OPP mid-way through the transition to the first OPP. Due to this ability to change OPP trajectory quickly while still observing all boundary conditions, SOC may respond more quickly to changes in the operational environment, such as the instantaneous computational or communications demand. An arbitrarily complex set of constraints may be imposed by specifying relatively few parameters, and defining a few zones in which the different constraints apply.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of controlling a plurality of supply voltages provided to one or more electronic circuits, wherein permissible values of at least first and second voltages of the plurality of supply voltages are constrained both absolutely and relative to each other, the method comprising:
    dividing a range of permissible values of the first voltage of the plurality of supply voltages into two or more zones;
    defining a plurality of Operating Performance Points (OPP), each OPP specifying values for the first and second voltages of the plurality of supply voltages;
    selecting a target OPP;
    ramping a first voltage value from a current value to the target OPP value for the first voltage of the plurality of supply voltages; and
    generating the target second voltage value within each zone by one of:
        selecting a target second voltage value, and
        selecting a target offset value and adding the target offset value to the first voltage value; and
    ramping the second voltage value from a current value to the generated target second voltage value for a current zone;
    wherein the second voltage value is constrained, both in a voltage value and in a difference between the second voltage value and the first voltage value, constraints being unique to each zone.

2. The method of claim 1 wherein dividing a range of permissible values of the first voltage into two or more zones comprises defining one or more trigger point voltage values, and comparing the first voltage value to the one or more trigger point values, the outputs of the comparison defining the current zone.

3. The method of claim 2 wherein the outputs of the comparison select, for the current zone, the selected target second voltage value or target offset value added to the first voltage value.

4. The method of claim 1 wherein generating the target second voltage value comprises selecting a target offset value and adding the target offset value to the first voltage value, and further comprising constraining the selected target offset value, prior to adding it to the first voltage value, and throughout a duration of ramping the second voltage value within the current zone, to be within maximum or minimum offset values selected for the current zone.

5. The method of claim 4 wherein the maximum or minimum offset values are selected by the outputs of the comparison of the first voltage value to the one or more trigger point values.

6. The method of claim 4 further comprising constraining the target second voltage value, after adding the offset to the first voltage value, and throughout the duration of ramping the second voltage value within the current zone, to be within maximum or minimum absolute voltage values selected for the current zone.

7. The method of claim 6 wherein the maximum or minimum offset values are selected by the outputs of the comparison of the first voltage value to the one or more trigger point values.

8. The method of claim 1 further comprising converting the first and second voltage values to first and second supply voltage signals having corresponding voltage levels.

9. The method of claim 1, further comprising, prior to operation, initializing a plurality of registers to contain:
    first voltage values and at least one of corresponding second voltage values or offset values, for two or more OPPs; and
    one or more trigger point voltage values.

10. The method of claim 9, further comprising, prior to operation, initializing the plurality of registers to contain:
    at least one maximum or minimum permissible offset value; and
    at least one maximum or minimum permissible absolute second voltage value.

11. The method of claim 1, further comprising generating a target third voltage value, wherein the target third voltage value is constrained, both in the voltage value and in the difference between the third voltage value and the first voltage value, constraints being unique to each zone.

12. A power management unit, comprising:
    a digital control circuit operative to generate first and second voltage values that gradually ramp between selected Operating Performance Points (OPP), each OPP specifying values for the first and second voltage values, in response to OPP selections communicated to the power management unit; and
    first and second voltage regulators operative to convert the first and second voltage values to first and second supply voltage signals having corresponding voltage levels;
    wherein the digital control circuit comprises
        a plurality of registers storing at least one trigger point value, the at least one trigger point value dividing a permissible range of values of the first voltage into two or more zones; and
        a regulator control circuit operative to generate the first and second voltage values according to OPP target values read from the plurality of registers, whereby the second voltage value is constrained, both in a voltage value and in a difference between the second voltage value and the first voltage value, constraints being unique to each zone.

13. The power management unit of claim 12 wherein the regulator control circuit comprises a plurality of digital comparators operative to compare a first voltage value with one or more corresponding trigger point voltage values, to define a plurality of voltage zones.

14. The power management unit of claim 13 wherein an output of the plurality of digital comparators constrain the value of the second voltage within each zone by selecting a target second voltage value for the current zone from a plurality of target second voltage values.

15. The power management unit of claim 14 wherein each of the plurality of target second voltage values is one of:
    a target second voltage value stored in a register; or
    an offset value stored in a register, and further comprising an adder operative to add the offset value to the first voltage value.

16. The power management unit of claim 14 further comprising a ramping circuit operative to ramp the second voltage value from a current value to the target second voltage value for the current zone.

17. The power management unit of claim 13 further comprising:
- a selector circuit operative to select a target offset value from a register in response to an OPP selection communicated to the power management unit; and
- a ramping circuit operative to ramp an offset value from a current value to the selected target offset value.

18. The power management unit of claim 17 further comprising:
- one or more selector circuits operative to select minimum or maximum offset values from one or more registers in response to the outputs of the plurality of digital comparators;
- a first limiting circuit operative to limit the selected target offset value to a minimum or maximum offset value for the current voltage zone; and
- an adder operative to add an output of the limiting circuit to the first voltage value.

19. The power management unit of claim 18 further comprising:
- one or more selector circuits operative to select minimum or maximum absolute voltage values from one or more registers in response to the outputs of the plurality of digital comparators;
- a second limiting circuit operative to limit an output of the adder to a minimum or maximum offset value for the current voltage zone, to generate the second voltage value.

20. The power management unit of claim 12 further comprising an interface circuit operative to dynamically receive data during operation, the data comprising one or more of OPP voltage values, offsets corresponding to OPP voltage values, minimum or maximum offset limits, minimum or maximum absolute voltage limits, and trigger points defining voltage ranges.

21. A method of controlling a plurality of supply voltages provided to one or more electronic circuits, wherein permissible values of at least first and second voltages of the plurality of supply voltages are constrained both absolutely and relative to each other, the method comprising:
- defining a plurality of Operating Performance Points (OPP), each OPP specifying values for the first and second voltages of the plurality of supply voltages;
- selecting a target OPP;
- ramping a first voltage value from a current value to the target OPP value for the first voltage; and
- generating a second voltage value as a function of the first voltage value, such that the second voltage value is constrained to predetermined deviations from the first voltage value as the second voltage value ramps to the target OPP value for the second voltage.

* * * * *